(12) United States Patent
Choi et al.

(10) Patent No.: US 11,940,734 B2
(45) Date of Patent: Mar. 26, 2024

(54) APPARATUS AND METHOD FOR TREATING SUBSTRATE

(71) Applicant: SEMES CO., LTD., Cheonan-si (KR)

(72) Inventors: Ki Hoon Choi, Cheonan-si (KR); Eung Su Kim, Cheonan-si (KR); Pil Kyun Heo, Hwaseong-si (KR); Jin Yeong Sung, Chungcheongbuk-do (KR); Hae-Won Choi, Daejeon (KR); Anton Koriakin, Cheonan-si (KR); Joon Ho Won, Suwon-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 78 days.

(21) Appl. No.: 17/726,343

(22) Filed: Apr. 21, 2022

(65) Prior Publication Data
US 2023/0341779 A1    Oct. 26, 2023

(51) Int. Cl.
  *G03F 7/30* (2006.01)
  *F26B 5/00* (2006.01)
(52) U.S. Cl.
  CPC ............... *G03F 7/30* (2013.01); *F26B 5/005* (2013.01)
(58) Field of Classification Search
  CPC ................................... G03F 7/30; F26B 5/005
  See application file for complete search history.

(56) References Cited

U.S. PATENT DOCUMENTS

| | | | | |
|---|---|---|---|---|
| 11,515,142 B2* | 11/2022 | Fukui | ............... | H01L 21/67051 |
| 11,621,159 B2* | 4/2023 | Kim | ................ | B08B 7/0071 |
| | | | | 134/30 |
| 11,664,212 B2* | 5/2023 | Hong | ................ | H01L 21/67051 |
| | | | | 438/761 |
| 2022/0008964 A1* | 1/2022 | Choi | ................ | H01L 21/67248 |
| 2022/0325953 A1* | 10/2022 | Park | ............. | F26B 3/02 |

FOREIGN PATENT DOCUMENTS

| JP | 2004327894 A | 11/2004 |
|---|---|---|
| JP | 2005187879 A | 7/2005 |
| JP | 2007175559 A | 7/2007 |
| JP | 2008130685 A | 6/2008 |
| JP | 2012087983 A | 5/2012 |
| JP | 2013033963 A | 2/2013 |
| JP | 2015188060 A | 10/2015 |
| JP | 2017059642 A | 3/2017 |
| JP | 2019160910 A | 9/2019 |

(Continued)

*Primary Examiner* — Hung V Nguyen
(74) *Attorney, Agent, or Firm* — Procopio, Cory, Hargreaves & Savitch LLP

(57) ABSTRACT

The inventive concept provides a substrate treating apparatus. The substrate treating apparatus includes a chamber having a treating space therein; a supply line having a first open/close valve installed thereon and configured to supply a treating fluid to the treating space; a heater installed on the supply line and configured to heat the treating fluid; an exhaust line having a second open/close valve installed thereon and configured to exhaust the treating space; and, a controller configured to control the first open/close value and the second open/close valve such that the treating fluid heated is supplied to and exhausted from the treating space before a treating process is performed on a substrate in the treating space.

19 Claims, 14 Drawing Sheets

(56) References Cited

FOREIGN PATENT DOCUMENTS

| KR | 1020140030218 A | 3/2014 |
| KR | 1020150062908 A | 6/2015 |
| KR | 101536724 B1 | 7/2015 |
| KR | 101681190 B1 | 11/2016 |
| KR | 20180055731 A | 5/2018 |
| KR | 1020200030653 A | 3/2020 |
| WO | 2017014416 A1 | 1/2017 |

* cited by examiner

APPARATUS AND METHOD FOR TREATING SUBSTRATE

BACKGROUND

Embodiments of the inventive concept described herein relate to a substrate treating apparatus and a substrate treating method.

In order to manufacture a semiconductor device, various processes such as a deposition process, a photolithography process, an etching process, and a cleaning process are performed. Among them, the photolithography process includes a coating process, an exposing process, and a developing process. The coating process is a process of coating a photosensitive solution such as a photoresist on a substrate. The exposing process is a process of exposing the substrate coated with the photoresist through a photomask defining a circuit pattern to a light. Also, the developing process is a process of selectively developing an exposed or unexposed photoresist.

The developing process generally includes a developing liquid supply step, a rinsing liquid supply step, and a drying step. In the drying step, a spin chuck supporting the substrate is rotated, and a spin drying is performed to dry a developing liquid or a rinsing liquid remaining on the substrate using a centrifugal force applied by the spin chuck to the substrate.

Recently, as a critical dimension CD between patterns formed on the substrate becomes finer, fine patterns tend to collapse or bent (leaning phenomenon) during the above-described spin drying.

SUMMARY

Embodiments of the inventive concept provide an apparatus for effectively performing a developing treatment.

Embodiments of the inventive concept provide an apparatus for preventing a leaning phenomenon in which patterns are collapsed or bent.

Embodiments of the inventive concept provide a platform of a substrate treating apparatus for effectively performing a developing process and a supercritical process.

Embodiments of the inventive concept provide a platform of a substrate treating apparatus which can clean a non-patterned surface of a substrate.

Embodiments of the inventive concept provide a substrate treating apparatus for compensating a temperature of a supercritical fluid supplied at a supercritical treating process.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a chamber having a treating space therein; a supply line having a first open/close valve installed thereon and configured to supply a treating fluid to the treating space; a heater installed on the supply line and configured to heat the treating fluid; an exhaust line having a second open/close valve installed thereon and configured to exhaust the treating space; and, a controller configured to control the first open/close value and the second open/close valve such that the treating fluid heated is supplied to and exhausted from the treating space before a treating process is performed on a substrate in the treating space.

In an embodiment, the controller controls the first open/close valve and the second open/close valve to supply and exhaust the heated treating fluid to and from the treating space, before the substrate is introduced to the treating space.

In an embodiment, the supply line comprises a top supply line connected to a top wall of the chamber, and a bottom supply line connected to a bottom wall of the chamber, and wherein the heater comprises a first heater installed on the top supply line, and a second heater installed on the bottom supply line.

In an embodiment, the treating fluid is supplied substantially simultaneously to the top supply line and the bottom supply line before the substrate is introduced to the treating space.

In an embodiment, the substrate treating apparatus further comprises a filter installed on the supply line at a downstream side of the heater.

In an embodiment, the controller controls such that the substrate is introduced to the treating space when the treating fluid is heated by the heater to a preset temperature or higher.

In an embodiment, the preset temperature is lower than a critical temperature of the treating fluid.

In an embodiment, the treating fluid is a fluid in a supercritical state.

In an embodiment, the first open/close valve comprises: a top open/close valve installed on the top supply line; and a bottom open/close valve installed on the bottom supply line, and wherein the controller controls the top open/close valve and the bottom open/close valve to be simultaneously opened, before a treating process of the substrate is performed.

In an embodiment, the fluid in a supercritical state dries a developing liquid remaining on the substrate.

The inventive concept provides a substrate treating apparatus. The substrate treating apparatus includes an index module including a container for storing a substrate; and a treating module configured to perform a process on the substrate, and wherein the treating module comprises: a buffer unit configured to temporarily store the substrate; a wet treating chamber configured to perform a developing process on the substrate by supplying a developing liquid; a supercritical treating chamber configured to treat the substrate by supplying a supercritical fluid; a heat treating chamber configured to perform a heat treating process on the substrate; and a transfer chamber including a transfer unit configured to transfer the substrate between the wet treating chamber, the supercritical treating chamber, and the heat treating chamber, and wherein the supercritical treating chamber comprises: a supply line configured to supply the supercritical fluid to a treating space therein; a heater installed on the supply line and configured to heat the treating fluid; an exhaust line configured to exhaust the treating space; and a controller configured to control the supply line and the exhaust as to supply and exhaust the treating fluid heated to and from the treating space, before a treating process is performed on the substrate in the treating space.

In an embodiment, the supply line comprises a top supply line connected to a top wall of the chamber and a bottom supply line connected to a bottom wall of the chamber, and wherein the heater comprises a first heater installed on the top supply line and a second heater installed on the bottom supply line.

In an embodiment, the controller controls such that the treating fluid is substantially supplied to the top supply line and the bottom supply line.

In an embodiment, the substrate treating apparatus further comprises a filter installed on the supply line at a downstream side of the heater.

In an embodiment, the treating fluid is a fluid in a supercritical state.

The inventive concept provides a substrate treating method. The substrate treating method includes a sealing step for sealing a treating space; a pre-supply step for supplying and discharging a treating fluid to and from the treating space; a substrate treating step for treating a substrate by supplying the treating fluid to the treating space; and a taking out step for taking out the substrate from the treating space.

In an embodiment, the substrate treating method further comprises an introducing step for introducing the substrate to the treating space between the pre-supply step and the substrate treating step.

In an embodiment, the introducing step is performed after the treating fluid is heated to the preset temperature or higher in the pre-supply step.

In an embodiment, the treating fluid is supplied to the treating space via a supply path, the supply path comprising a first supply path in fluid communication with an upper zone of the treating space and a second supply path in fluid communication with a lower zone of the treating space, and wherein the treating fluid is substantially simultaneously supplied to the first supply path and the second supply path.

In an embodiment, the method performs a substrate treating process on a plurality of substrates; and wherein the pre-supply step is performed on each of the plurality of substrates.

According to an embodiment of the inventive concept, an apparatus for effectively performing a developing treatment is provided.

According to an embodiment of the inventive concept, an apparatus for preventing a leaning phenomenon in which patterns are collapsed or bent is provided.

According to an embodiment of the inventive concept, a platform of a substrate treating apparatus which can effectively perform a developing process and a supercritical process is provided.

According to an embodiment of the inventive concept, a platform of a substrate treating apparatus which can clean a non-patterned surface of a substrate is provided.

According to an embodiment of the inventive concept, a generation of reverse contamination due to contaminants of a non-patterned surface of a substrate is provided.

According to an embodiment of the inventive concept, a substrate treating apparatus for compensating a temperature of a supercritical fluid supplied at a supercritical treating process is provided.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
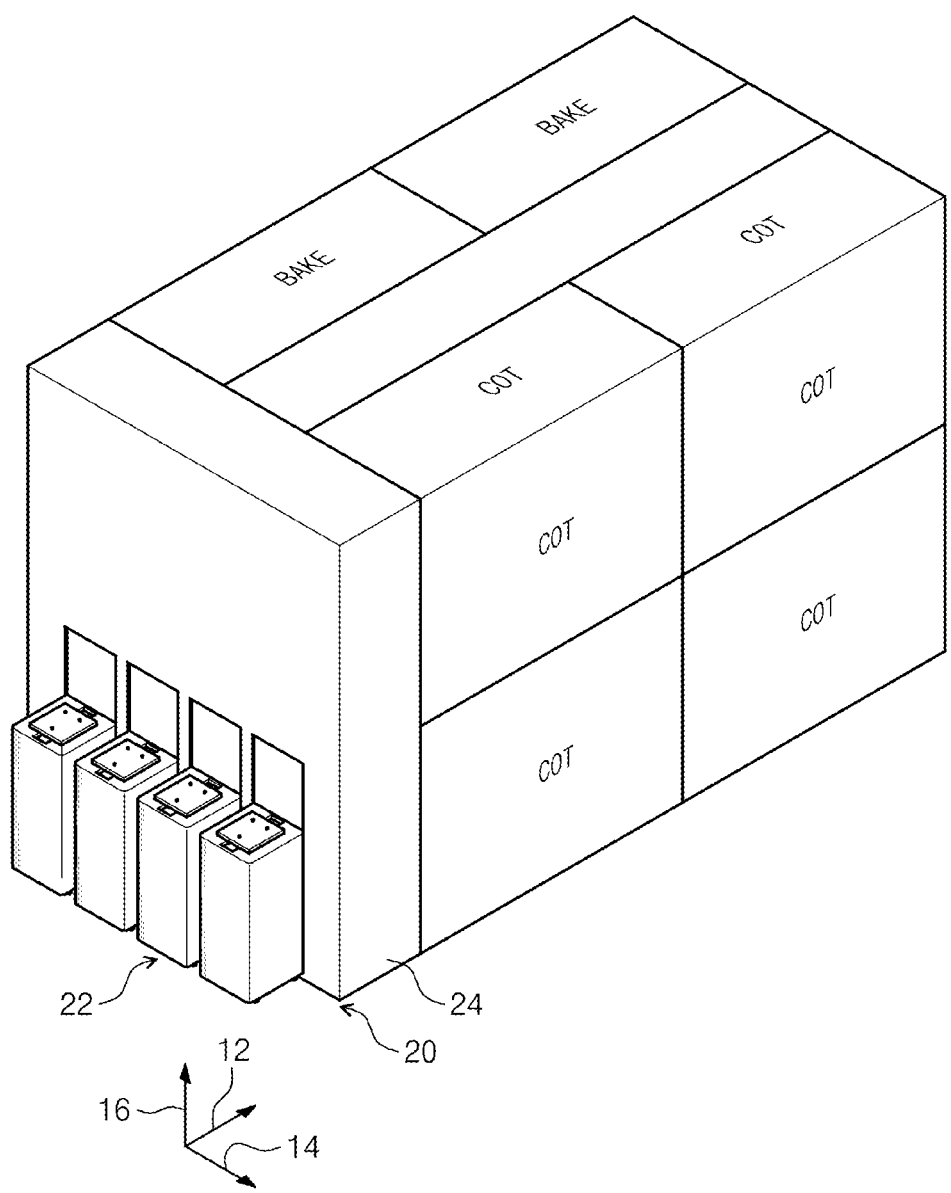
FIG. 1 illustrates a substrate treating apparatus for performing a coating process according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

A controller (not shown) may control an entire operation of the substrate treating apparatus. The controller (not shown) may include a central processing unit (CPU), a read only memory (ROM), and a random access memory (RAM). The CPU executes a desired treatment such as a liquid treatment and a drying treatment to be described later according to various recipes stored in the memory. The recipe may include a process time, a process pressure, a process temperature, various gas flows, etc., which are control information of the apparatus for process conditions. Meanwhile, recipes representing these programs or treating conditions may be stored in a hard disk or a semiconductor memory. In addition, the recipe may be set at a predetermined location in the memory such as a portable memory medium such as a CD-ROM or DVD.

Hereinafter, embodiments of the inventive concept will be described in detail with reference to the accompanying drawings, and in the description and drawings, the same or similar elements, features or components are denoted by like reference numerals and repeated descriptions thereof will be omitted.

Figure 2:
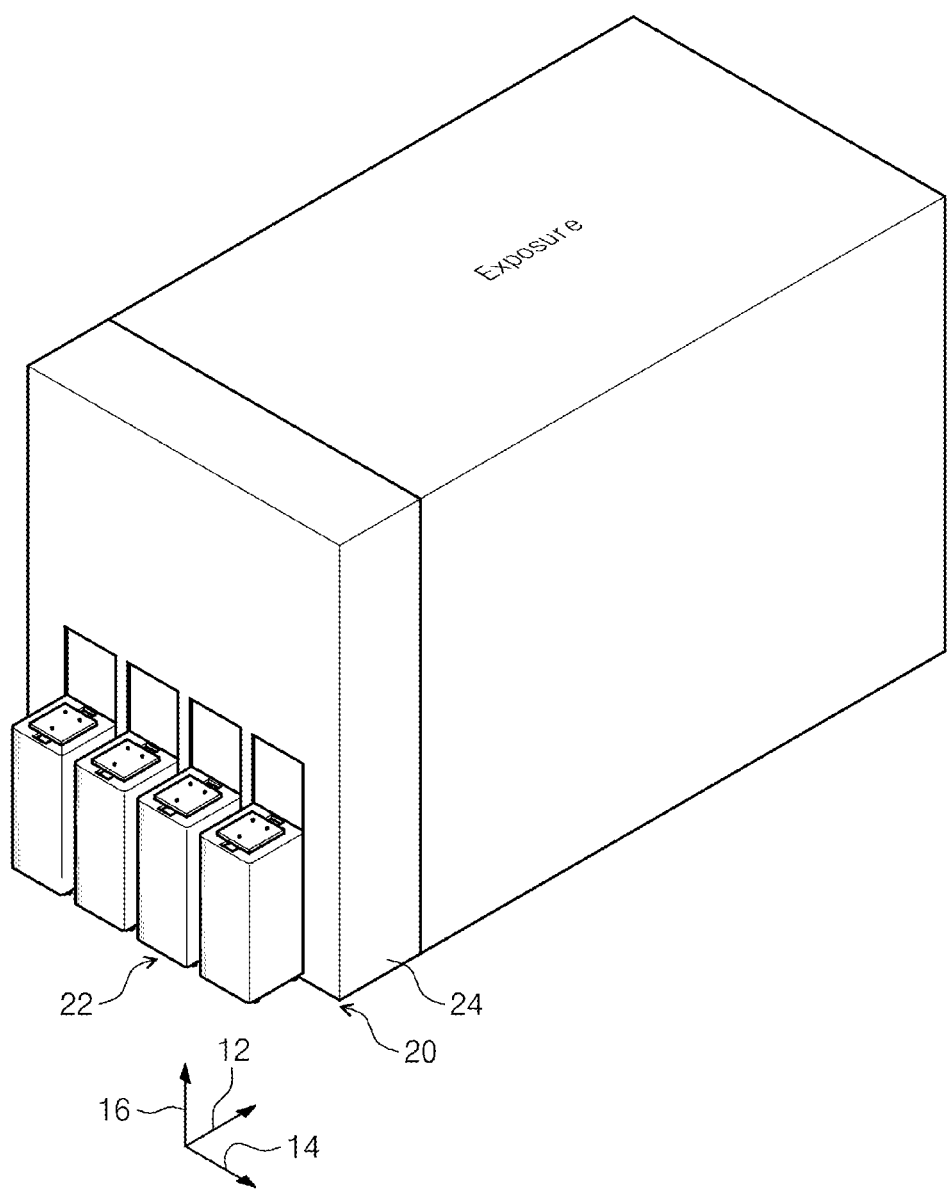
FIG. 2 illustrates the substrate treating apparatus for performing an exposing process according to an embodiment of the inventive concept.
Figure 3:
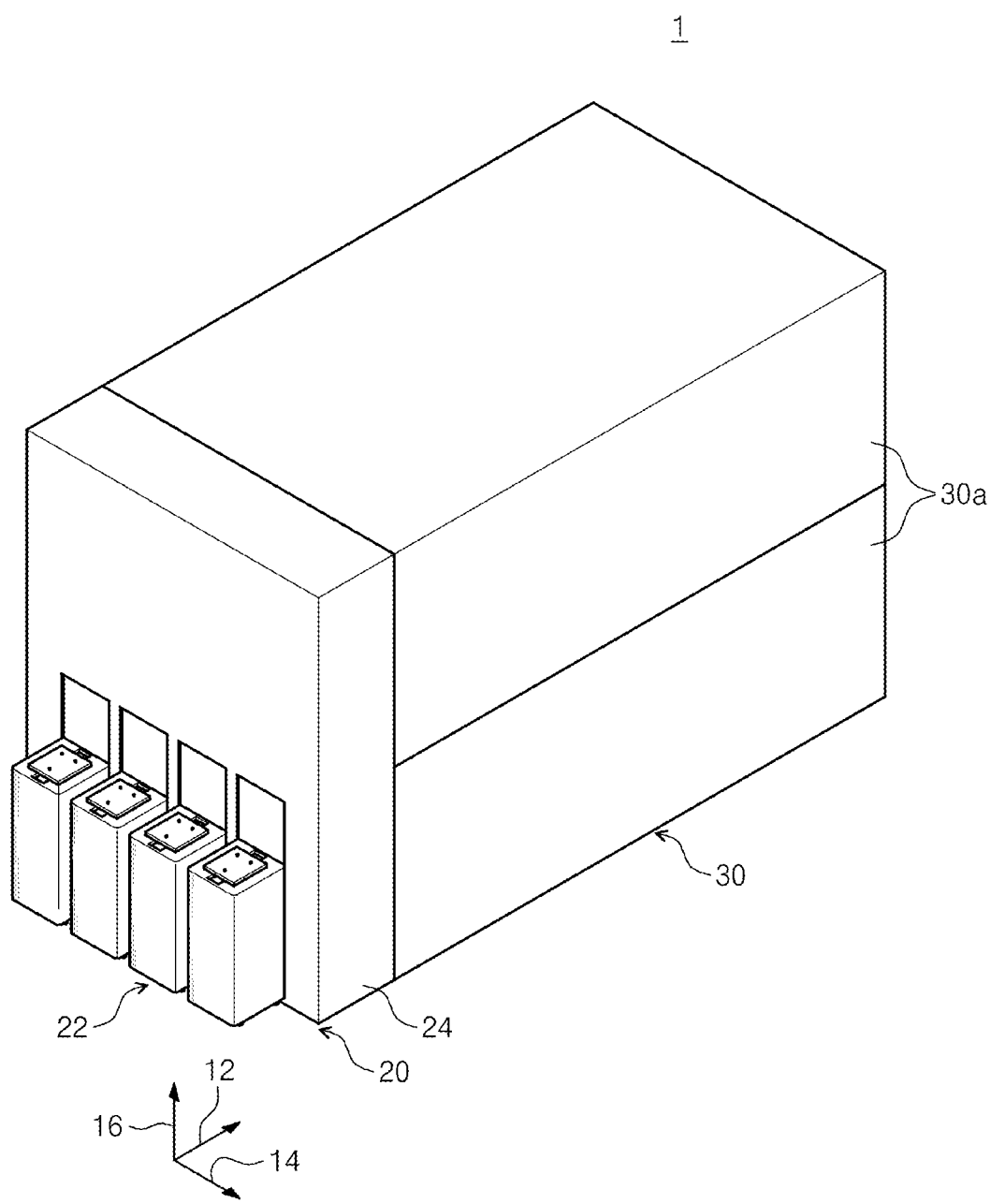
FIG. 3 illustrates the substrate treating apparatus for performing a developing process according to an embodiment of the inventive concept.

FIG. 1 illustrates a substrate treating apparatus which performs a coating process according to an embodiment of the inventive concept, FIG. 2 illustrates a substrate treating apparatus which performs an exposing process according to an embodiment of the inventive concept, and FIG. 3 illustrates a substrate treating apparatus which performs a developing process according to an embodiment of the inventive concept.

Referring to FIG. 1 to FIG. 3, according to the inventive concept, a coating process, an exposing process, and a developing process may be performed in different apparatus, respectively. Specifically, in the substrate treating apparatus of FIG. 1 which performs the coating process, a liquid film may be formed by applying a photoresist onto the substrate W. In the substrate treating apparatus which performs the coating process, a baking process of baking the substrate before and after forming the liquid film on the substrate W may be performed. The baking process may be a process of heating the substrate W to a process temperature or higher in a sealed space. In the baking process performed after the film is formed on the substrate W, a thickness of the film may be adjusted to a set thickness by heating and volatilizing the photoresist film coated on the substrate. After the coating process, the substrate W may be transferred to the substrate treating apparatus of FIG. 2 which performs the exposing process. The exposing process may be a process of exposing the substrate coated with the photoresist film to a light beam source via a photomask defining a circuit pattern. In the exposing process, a process of exposing a center of the substrate W and an edge exposing process of exposing an edge of the substrate W may be performed. After the exposing process is performed, the substrate W may be transferred to the substrate treating apparatus of FIG. 3 which performs the developing process. The developing process may be a process of selectively developing (e.g., selectively removing) an exposed or unexposed areas of the photoresist film of the substrate W. Hereinafter, a substrate treating apparatus which performs a developing process is performed will be described in more detail with reference to the drawings.

Figure 4:
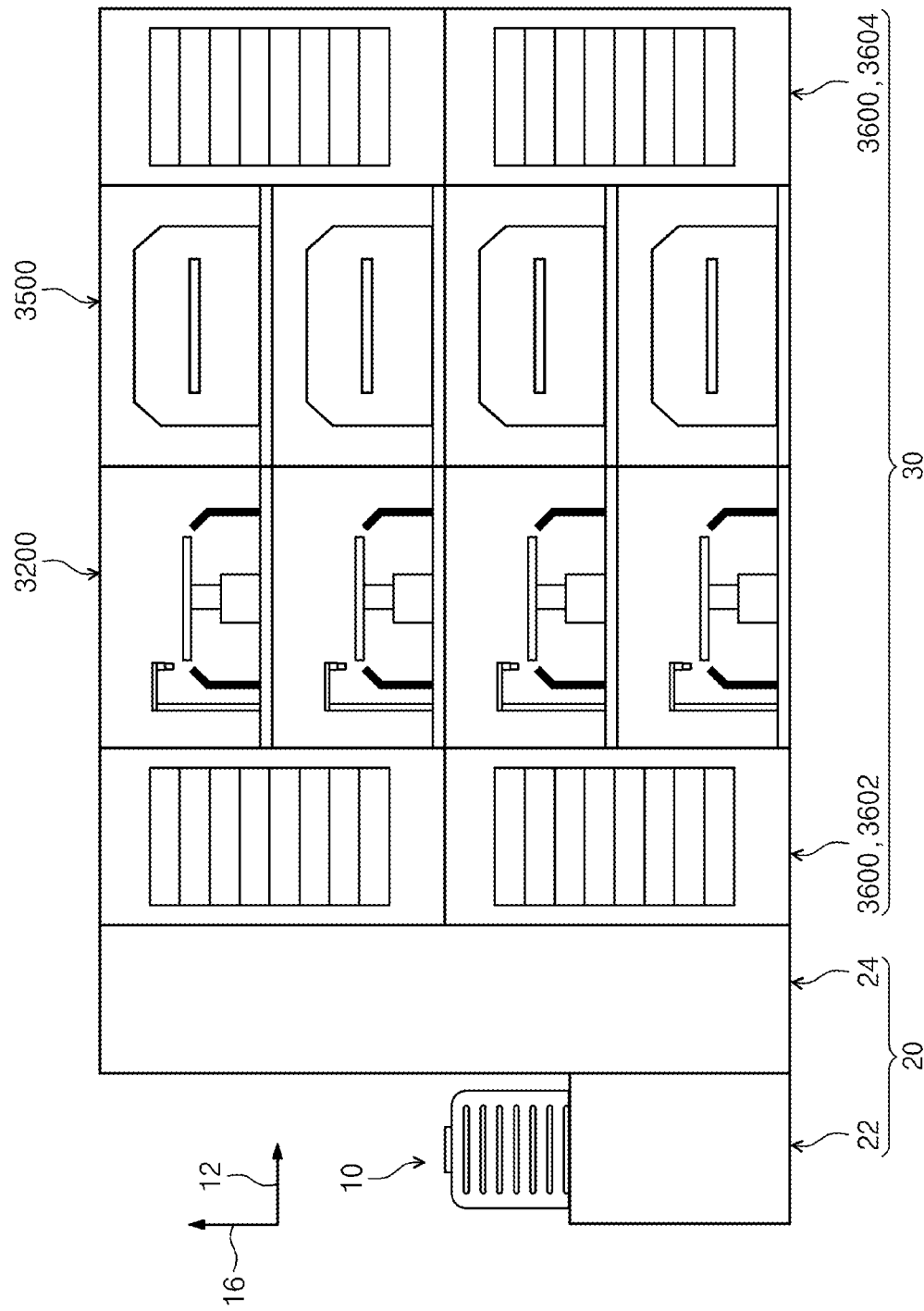
FIG. 4 is a cross-sectional view of the substrate treating apparatus of FIG. 3 viewed from a direction.
Figure 5:
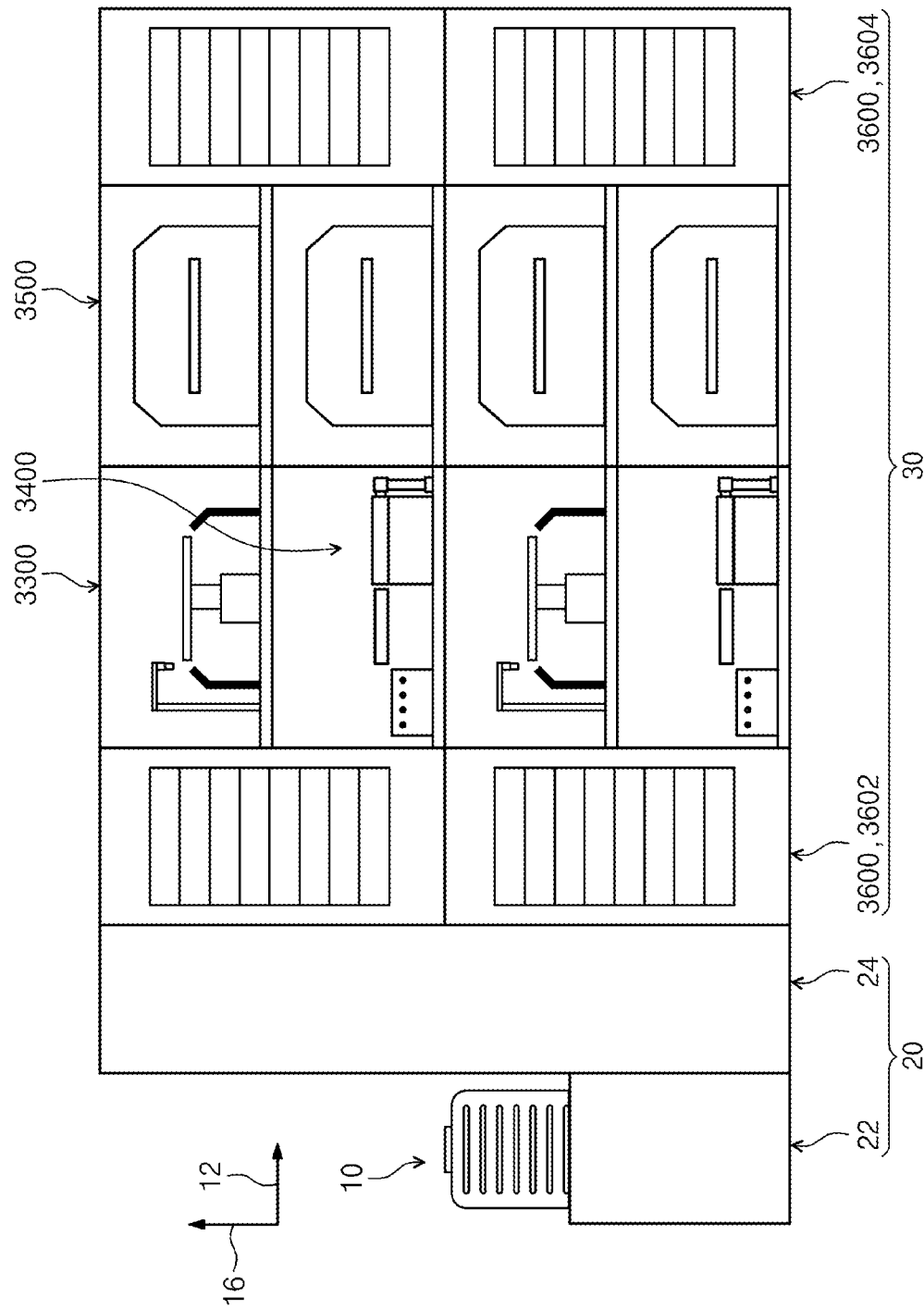
FIG. 5 is a cross-sectional view of the substrate treating apparatus of FIG. 3 from an opposite view from a direction.

FIG. 4 is a cross-sectional view of the substrate treating apparatus of FIG. 3 viewed from a direction, and FIG. 5 is a cross-sectional view of the substrate treating apparatus of FIG. 3 viewed from an opposite view from a direction.

Referring to FIG. 3 to FIG. 6, the substrate treating apparatus 1 may include an index module 20 and a treating module 30. According to an embodiment, the index module 20 and the treating module 30 may be sequentially arranged in a direction. Hereinafter, the direction in which the index module 20 and the treating module 30 are arranged is referred to as an X-axis direction 12, a direction perpendicular to the X-axis direction 12 when seen from above is referred to as a Y-axis direction 14, and a direction perpendicular to both the X-axis direction 12 and the Y-axis direction 14 is referred to as a Z-axis direction 16.

The index module 20 may transfer the substrate W from the container 10 in which the substrate W is accommodated to the treating module 30 for treating process, and may transfer the substrate W from the treating module 30 in which the treating process has been completed to the container 10. A lengthwise direction of the index module 20 may be provided in the Y-axis direction 14. The index module 20 may include a load port 22 and an index frame 24. The index frame 24 may be located between the load port 22 and the treating module 30. The container 10 in which the substrates W are accommodated may be placed on the load port 22. A plurality of load ports 22 may be provided, and the plurality of load ports 22 may be disposed along the Y-axis direction 14.

As the container 10, a sealing container 10 such as a front open unified pod (FOUP) may be used. The container 10 may be placed on the load port 22 by a means of transport (not shown) such as an overhead transfer, an overhead conveyor, or an automatic guided vehicle or an operator.

An index robot 2200 may be provided within the index frame 24. In the index frame 24, a guide rail 2300 extending along the Y-axis direction 14 may be provided, and the index robot 2200 may be provided to be movable on the guide rail 2300. The index robot 2200 includes a hand 2220 on which the substrate W is placed, and the hand 2220 may be provided to be forwardly and backwardly movable, rotatable in the Z-axis direction 16, and movable along the Z-axis direction 16.

According to an embodiment of the inventive concept, the treating module 30 may perform a treating process on the substrate W. For example, the treating module 30 may perform a wet treating process, a heat treating process, a back surface cleaning process, and a supercritical process on the substrate W.

The treating module 30 includes a treating block 30a. The treating block 30a may perform a treating process on the substrate W. A plurality of treating blocks 30a are provided, and they may be provided to be stacked on one another. According to an embodiment of FIG. 3, two treating blocks 30a may be provided. According to an embodiment, two treating blocks 30a may perform the same process and may have the same structure.

The treating block 30a may include a transfer chamber 3100, a wet treating chamber 3200, a back surface cleaning chamber 3300, a heat treating chamber 3400, a supercritical chamber 3500, and a buffer chamber 3600.

The transfer chamber 3100 may transfer the substrate W between the wet treating chamber 3200, the back surface cleaning chamber 3300, the heat treating chamber 3400, and the supercritical chamber 3500 in the treating block 30a. The transfer chamber 3100 may be provided with its lengthwise direction parallel to the X-axis direction 12. A transfer unit 3120 may be provided at the transfer chamber 3100. The transfer unit 3120 may transfer the substrate W between the wet treating chamber 3200, the back surface cleaning chamber 3300, the heat treating chamber 3400, and the supercritical chamber 3500. According to an embodiment, the transfer unit 3120 may have a hand A on which the substrate W is placed, and the hand A may be provided to be forwardly and backwardly movable, rotatable on the Z-axis direction 16 as an axis, and movable along the Z-axis direction 16. The transfer chamber 3100 may be provided with a guide rail 3140 extending along the X-axis direction 12, and the transfer unit 3120 may be provided to be movable on the guide rail 3140.

Figure 6:
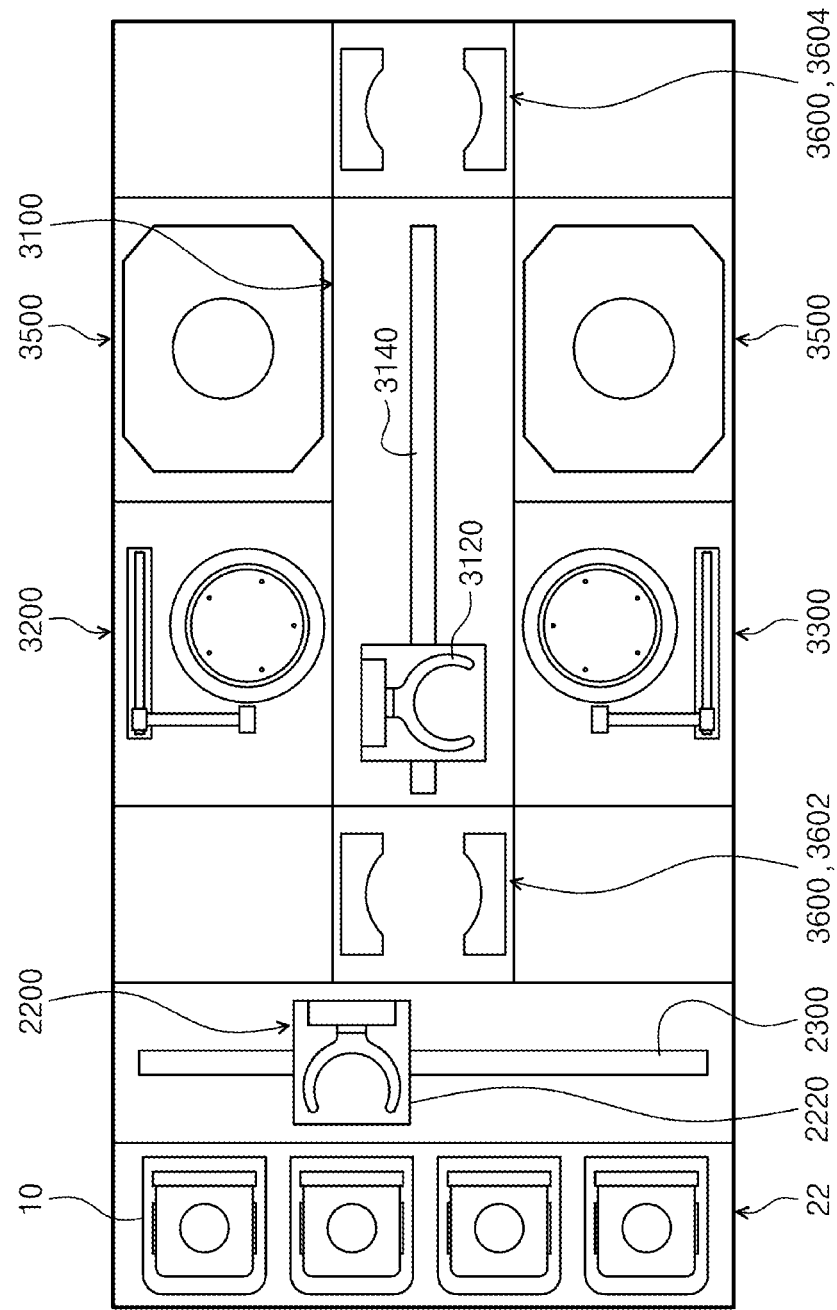
FIG. 6 is a plan view of the substrate treating apparatus of FIG. 3.
Figure 7:
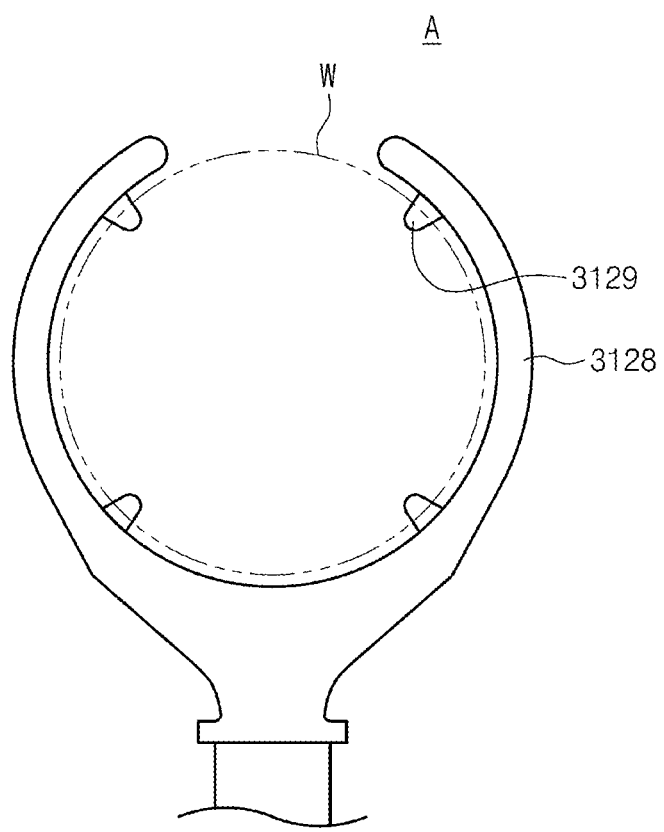
FIG. 7 illustrates an embodiment of a hand of a transfer robot of FIG. 6.

FIG. 7 is a view illustrating an embodiment of the hand of the transfer robot of FIG. 6. Referring to FIG. 7, the hand A may include a base 3128 and a support protrusion 3129. The base 3128 may have an annular ring shape with a portion of a circumference being cutout. The base 3128 may have an inner diameter larger than a diameter of the substrate W. The support protrusion 3129 may radially inwardly extend from the base 3128. A plurality of support protrusions 3129 may be provided and may support edge regions of the substrate W. According to an embodiment, four support protrusions 3129 may be provided at equal distance.

Referring again to FIG. 3 to FIG. 6, the heat treating chamber 3400 may perform a heat treating process on the substrate W. The heat treating chamber 3400 may be disposed on one side of the transfer chamber 3100. The heat treating chamber 3400 may include a plurality of heat treating chambers 3400. The heat treating chamber 3400 may be stacked with the back surface cleaning chamber 3300 along the Z-axis direction 16. The heat treating chamber 3400 may be disposed to face the wet treating chamber 3200 with the transfer chamber 3100 interposed therebetween. Namely, the heat treating chamber 3400 may be disposed on the other side of the transfer chamber 3100. The heat treating chamber 3400 may be disposed between the index module 20 and the supercritical chamber 3500. The heat treating chamber 3400 may be provided in a number smaller than the supercritical chamber 3500. The back surface cleaning chamber 3300 may be provided in a number smaller than the wet treating chamber 3200. The heat treating chamber 3400 may be provided in a number corresponding to the back surface cleaning chamber 3300. However, the inventive concept is not limited thereto, and may be changed in consideration of factors such as a foot printing and a process efficiency of the device.

Figure 8:
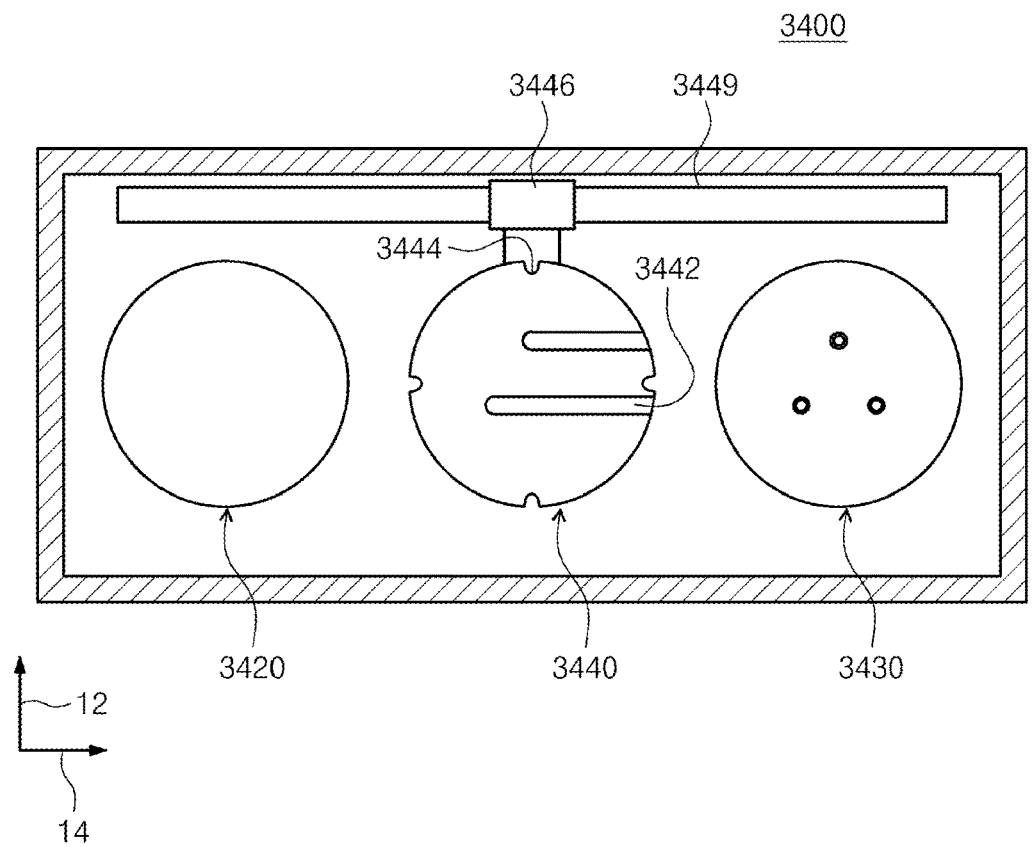
FIG. 8 is a plan cross-sectional view schematically illustrating an embodiment of a heat treating chamber of the substrate treating apparatus according to an embodiment of the inventive concept.
Figure 9:
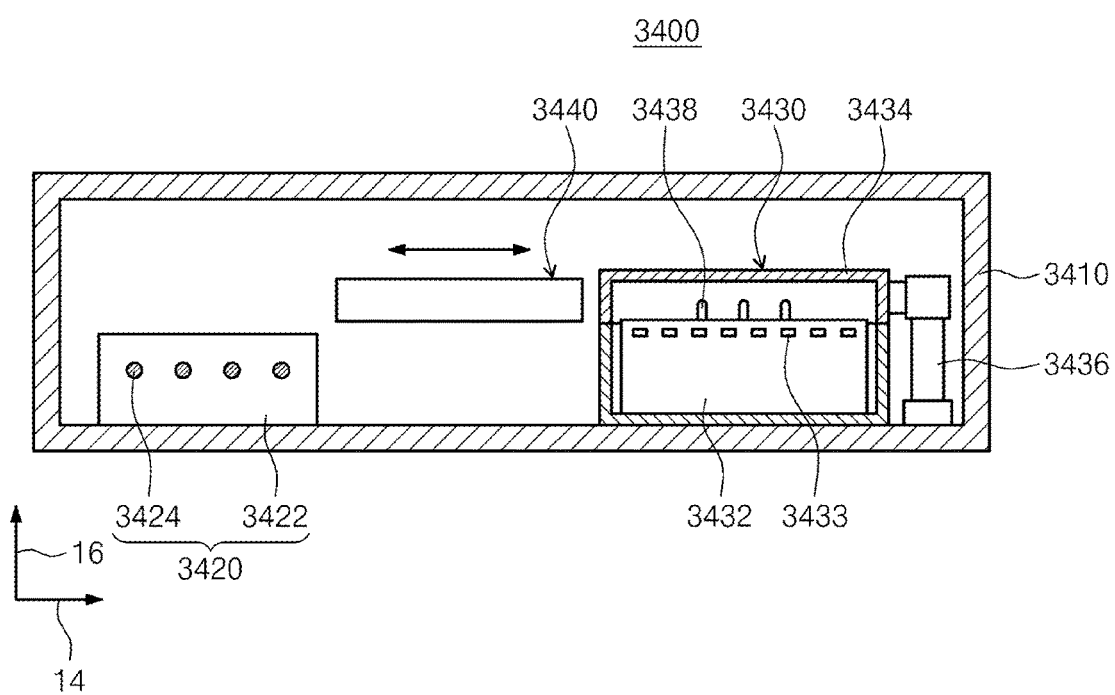
FIG. 9 is a front cross-sectional view of the heat treating chamber of FIG. 8.

FIG. 8 is a plan cross-sectional view schematically showing an embodiment of a heat treating chamber of a substrate treating apparatus according to an embodiment of the inventive concept, and FIG. 9 is a front cross-sectional view of the heat treating chamber of FIG. 8. Referring to FIG. 8 and FIG. 9, the heat treating chamber 3400 may include a housing 3410, a cooling unit 3420, a heating unit 3430, and a transfer plate 3440. The heat treating chamber 3400 may perform a heat treating process on the substrate W. The heat treating process may include a cooling process and a heating process.

The housing 3410 may be provided in a substantially rectangular parallelepiped shape. An inlet (not shown) through which the substrate W enters and exits may be formed on a sidewall of the housing 3410. The inlet may remain open. A door (not shown) may be provided to selectively open and close the inlet. The cooling unit 3420, the heating unit 3430, and the transfer plate 3440 may be provided in the housing 3410. The cooling unit 3420 and the heating unit 3430 may be provided side by side along the Y-axis direction 14. According to an embodiment, the cooling unit 3420 may be positioned closer to the transfer chamber 3100 than the heating unit 3430 is.

The cooling unit 3420 may include a cooling plate 3422. The cooling plate 3422 may have a disk shape when viewed from above. A cooling member 3424 may be provided in the cooling plate 3422. According to an embodiment, the cooling member 3424 is formed within the cooling plate 3422 and may be provided as a flow path through which a cooling fluid flows.

The heating unit 3430 may include a heating plate 3432, a cover 3434, and a heater 3433. The heating plate 3432 may have a disk shape when viewed from above. The heating plate 3432 may include a diameter larger than that of the substrate W. A heater 3433 may be installed in the heating plate 3432. The heater 3433 may be provided as a heating resistor to which a current is applied. Lift pins 3438 capable of driving in the up/down direction along the Z-axis direction 16 may be provided on the heating plate 3432. A lift pin 3438 may receive the substrate W from the transfer plate 3440 outside the heating unit 3430 and place the substrate W on the heating plate 3432 or lift the substrate W from the heating plate 3432 to hand over the substrate W to the transfer plate 3440 outside the heating unit 3430. According to an embodiment, three lift pins 3438 may be provided. The cover 3434 may have cup-shape. The cover 3434 is positioned above the heating plate 3432 and may be moved in the up/down direction by the driver 3436. The cover 3434 is moved between a closing position and an opening position. In a state in which the cover 3434 is downwardly moved and is positioned at the closed position, a space surrounded by the cover 3434 and the heating plate 3432 may be provided as a heating space for heating the substrate W. In a state in which the cover 3434 is upwardly moved and positioned in the open position, the substrate is taken out from the heating space and the substrate is taken into the heating space.

The transfer plate 3440 may have a substantially disk shape and may have a diameter corresponding to the substrate W. A notch 3444 may be formed at an edge of the transfer plate 3440. The notch 3444 may have a shape corresponding to the protrusion 3129 formed on the hand A of the transfer robot 3120 described above. In addition, the notch 3444 is provided in a number corresponding to the protrusion 3129 formed on the hand A, and may be formed at a position corresponding to the protrusion 3129. The substrate W can be transferred between the hand A and the transfer plate 3440. When transferring the substrate W from the hand A to the transfer plate 3440, the transfer plate 3440 moves toward the bottom side of the hand A supporting the substrate W and aligned below the hand A, and then the hand A moves downwardly below the transfer plate 3440 while the support protrusion 3129 passing through the notch of the transfer plate 3440, thereby the substrate W seats on the transfer plate 3440. The transfer plate 3440 may be mounted on the guide rail 3449 and may be moved along the guide rail 3449 by the driver 3446. A plurality of slit-shaped guide grooves 3442 may be provided in the transfer plate 3440. Each guide groove 3442 may extend from an edge of the transfer plate 3440 to an inside of the transfer plate 3440. The guide grooves 3442 may be provided with its lengthwise direction along the Y-axis direction 14, and the guide grooves 3442 may be spaced apart from each other along the X-axis direction 12. The guide grooves 3442 may prevent the transfer plate 3440 and the lift pin from interfering with each other when the substrate W is transferred between the transfer plate 3440 and the heating unit 3430. Namely, when transferring the substrate W to the heating unit 3430, the transfer plate 3440 supporting the substrate W moves over the heating unit 3430 such that the lift pins 3488 insert into respective guide groove 3442 and then the transfer plate 3440 moves away (e.g., laterally moves) from the heating unit 3430, thereby the substrate W seats on the lift pins 3448.

The substrate W is heated while the substrate W is directly placed on the heating unit 3430, and the substrate W is cooled while the transfer plate 3440 on which the substrate W is placed is in contact with the cooling plate 3222. The transfer plate 3440 may be made of a material having a high heat transfer rate so that a heat transfer between the cooling plate 3422 and the substrate W is well performed. According to an embodiment, the transfer plate 3440 may be made of a metal material.

Referring again to FIG. 3 to FIG. 6, the back surface cleaning chamber 3300 may clean a non-patterned surface of the substrate W. The back surface cleaning chamber 3300 may be disposed on one side of the transfer chamber 3100. The back surface cleaning chamber 3300 may include a plurality of back surface cleaning chambers 3300. The back surface cleaning chamber 3300 may be stacked with the heat treating chamber 3400 in the up/down direction. The back surface cleaning chamber 3300 may be disposed to face the wet treating chamber 3200 with the transfer chamber 3100 interposed therebetween. The back surface cleaning chamber 3300 may be disposed between the index module 20 and the supercritical chamber 3500. The back surface cleaning chamber 3300 may be provided in a smaller number than the supercritical chamber 3500. The back surface cleaning chamber 3300 may be provided in a smaller number than the wet treating chamber 3200. The back surface cleaning chamber 3300 may be provided in a number corresponding to the heat treating chamber 3400. However, the inventive concept is not limited thereto, and may be changed in consideration of factors such as a foot printing and a process efficiency of the device.

Figure 10:
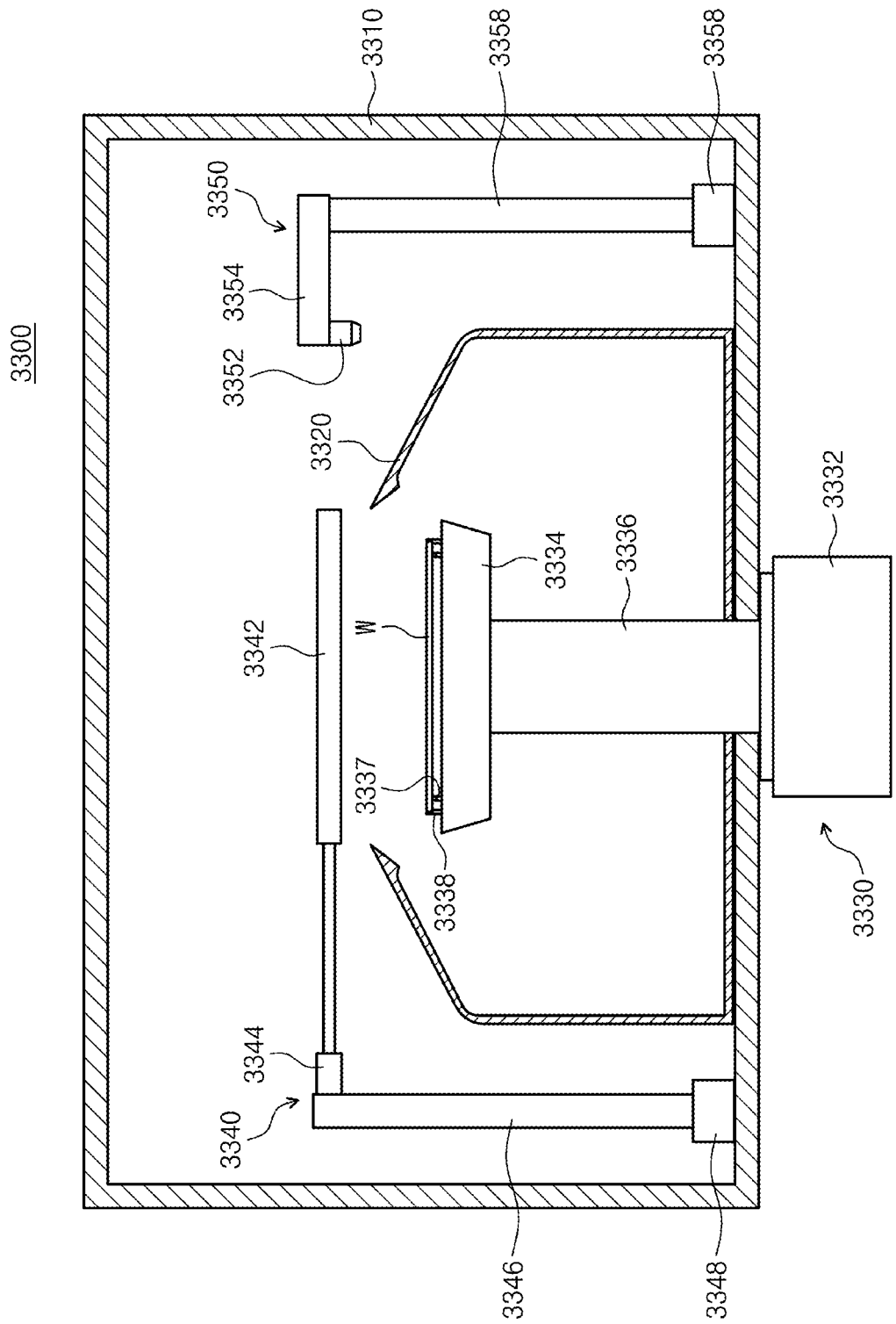
FIG. 10 schematically illustrates a rear cleaning chamber of the substrate treating apparatus according to an embodiment of the inventive concept.

FIG. 10 is a view schematically illustrating a back surface cleaning chamber of the substrate treating apparatus according to an embodiment of the inventive concept. Referring to FIG. 10, the back surface cleaning chamber 3300 may include a housing 3310, a treating container 3320, a substrate support unit 3330, an inverting unit 3340, and a cleaning unit 3350.

The housing 3310 may provide a treating space therein in which the non-patterned surface of the substrate W is cleaned. The treating container 3320 may be disposed within the housing 3310. The treating container 3320 has a cylindrical shape with an open top portion and may provide a treating space for treating the substrate W. The open top surface of the treating container 3320 may be provided as a passage through which the substrate W is taken out and brought in. A substrate support unit 3330 may be positioned within the treating container 3320. The substrate support unit 3330 may support the substrate W during a process and may rotate the substrate.

The substrate support unit 3330 may be installed within the treating container 3320. The substrate support unit 3330 may support the substrate W during a process. The substrate support unit 3330 may be rotated by a driving unit 3332 to be described later during a process. The substrate support unit 3330 may include a spin head 3334, a support shaft 3336, and a driving unit 3332.

The spin head 3334 may include a circular top surface. The support shaft 3336 supporting the spin head 3334 may be connected to a bottom of the spin head 3334. The support shaft 3336 may be rotated by the driving unit 3332 connected to a bottom end thereof. The driving unit 3332 may be provided with a motor or the like. As the support shaft 3336 rotates, the spin head 3334 and the substrate W may rotate.

The inverting unit 3340 may be positioned above the treating container 3320. The inverting unit 3340 may invert the substrate W such that the non-patterned surface of the substrate faces upward and then load the inverted substrate W onto the spin head 3334. The inverting unit 3340 may include a holding part 3342 on which the substrate W to be treated is loaded, an inverting part 3344 for inverting the holding part 3342, and an elevating part 3346 for elevating the inverting part 3344. In this case, the inverting unit 3344 is for inverting the holding unit 3342 by 180 degrees, and a driving device 3348 such as a motor may be used. The elevating part 3346 is for elevating the inverting part 3344 in a vertical direction (a direction parallel to a direction of the support shaft 3336), and a linear driving device such as a cylinder, a linear motor, or a lead screw using the motor may be used.

The holding part 3342 of the inverting unit 3340 may simultaneously perform a buffer function in which not only a substrate W to be inverted but also a substrate W on temporarily standby may be placed.

The cleaning unit 3350 may supply a cleaning fluid to a substrate W in which the non-patterned surface is upwardly exposed by the inverting unit 3340. The cleaning unit 3350 may discharge the cleaning fluid toward the non-patterned surface of the substrate W. As another example, the cleaning unit 3350 may perform a physical cleaning on the non-patterned surface of the substrate W using a brush or the like. The cleaning unit 3350 may include a nozzle 3352 for discharging the cleaning fluid, a nozzle arm 3354 for supporting the nozzle 3352, a support shaft 3356 for supporting and moving the nozzle arm 3354 and a driving unit 3258 for applying a driving force to the support shaft 3356.

Referring again to FIG. 3 to FIG. 6, the supercritical chamber 3500 processes the substrate W by supplying a supercritical fluid to the substrate W. In an embodiment, the supercritical chamber 3500 may dry the substrate W by supplying the supercritical fluid to the substrate W. The supercritical chamber 3500 may perform a drying process on a substrate W which has been treated in the wet treating chamber 3200. In an embodiment, the supercritical chamber 3500 may perform a drying process on a substrate W which has been developed in the wet treating chamber 3200. In this case, the supercritical chamber 3500 may dry a developing liquid remaining in the substrate W. In an embodiment, the supercritical chamber 3500 may perform a drying process on the substrate W which has been cleaned in the wet treating chamber 3200. In this case, the supercritical chamber 3500 may dry an organic solvent remaining on the substrate W.

The supercritical chamber 3500 may be disposed on both sides of the transfer chamber 3100. The supercritical chamber 3500 may include a plurality of supercritical chambers 3500. A plurality of supercritical chambers 3500 may be stacked in the up/down direction. The supercritical chamber 3500 may be disposed far from the index module 20 in the second direction 14 than the wet treating chamber 3200, the back surface cleaning chamber 3300, and the heat treating chamber 3400 is. The supercritical chambers 3500 may be disposed on two opposite sides of the transfer chamber 3100 with facing each other. However, the inventive concept is not limited thereto, and may be changed in consideration of factors such as a foot printing and a process efficiency of the device.

Figure 11:
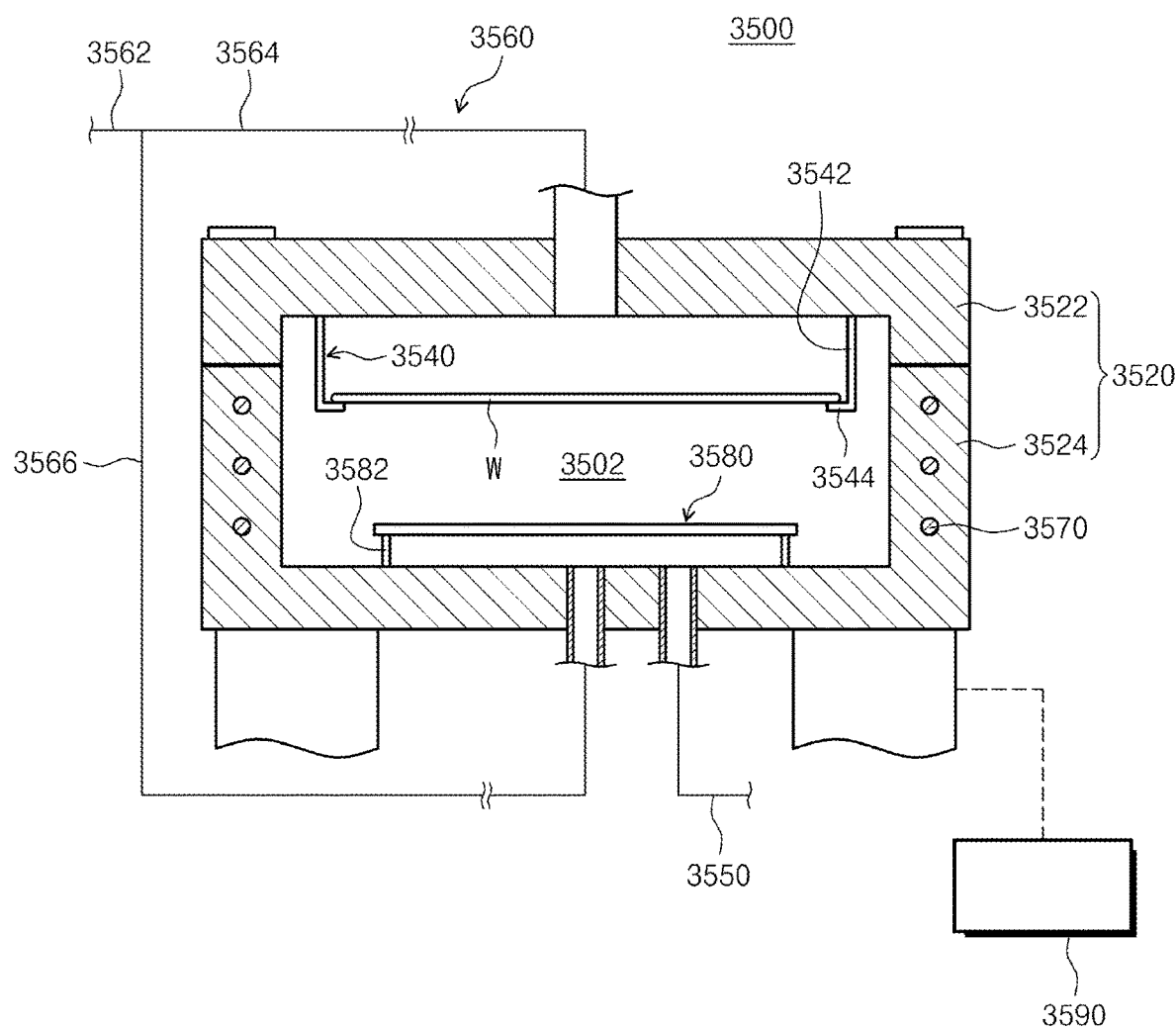
FIG. 11 schematically illustrates a supercritical chamber of the substrate treating apparatus according to an embodiment of the inventive concept.

FIG. 11 is a view schematically illustrating the supercritical chamber of a substrate treating apparatus according to an embodiment of the inventive concept.

The supercritical chamber 3500 removes a liquid on the substrate W using the supercritical fluid. The supercritical chamber 3500 has a body 3520, a support 3540, a fluid supply unit 3560, and a blocking plate 3580. The body 3520 provides an inner space 3502 in which a drying process is performed. The body 3520 has a top body 3522 and a bottom body 3524, and the top body 3522 and the bottom body 3524 are combined with each other to provide the above-described inner space 3502. The top body 3522 is provided above the bottom body 3524. A position of the top body 3522 may be fixed, and the bottom body 3524 may be lowered and raised by a driving member 3590 such as a cylinder. When the bottom body 3524 is spaced apart from the top body 3522, the inner space 3502 is opened, and at this time, the substrate W is brought in or taken out. During a process, the bottom body 3524 is in close contact with the top body 3522 to seal the inner space 3502 from the outside. The drying chamber 3500 has a heater 3570. According to an embodiment, the heater 3570 is located within a wall of the body 3520. The heater 3570 heats the inner space 3502 of the body 3520 so that the fluid supplied into the inner space of the body 3520 maintains a supercritical state. The support 3540 supports the substrate W in the inner space 3502 of the body 3520. The support 3540 has a fixing rod 3542 and a holder 3544. The fixing rod 3542 is fixedly installed on the top body 3522 to downwardly protrude from a bottom surface of the top body 3522. The fixing rod 3542 is provided with its lengthwise direction in the up/down direction. A plurality of fixing rods 3542 are provided and are spaced apart from each other. The fixing rods 3542 are disposed so that the substrate W does not interfere with the fixing rods 3542 when the substrate W is carried in or out of the space surrounded by them. A holder 3544 is coupled to each of the fixing rods 3542. The holder 3544 extends from a bottom end of the fixing rod 3542 toward a space surrounded by the fixing rods 3542. Due to the above-described structure, an edge region of the substrate W brought into the inner space 3502 of the body 3520 is placed on the holder 3544, and an entire top surface of the substrate W, a center region of the bottom surface of the substrate W, and a part of an edge region of the bottom surface of the substrate W are exposed to the drying fluid supplied to the inner space 3502. The fluid supply unit 3560 supplies the drying fluid to the inner space 3502 of the body 3520. According to an embodiment, the drying fluid may be supplied to the inner space 3502 in a supercritical state. On the other hand, the drying fluid may be supplied to the inner space 3502 in a gas state, and may be phase-changed to the supercritical state in the inner space 3502. According to an embodiment, the fluid supply unit 3560 has a main supply line 3562, a top branch line 3564, and a bottom branch line 3566. The top branch line 3564 and the bottom branch line 3566 branch from the main supply line 3562. The top branch line 3564 is coupled to the top body 3522 to supply the drying fluid from upper area of the inner space toward the top surface of the substrate W placed on the support body. According to an embodiment, the top branch line 3564 is coupled to a center of the top body 3522. The bottom branch line 3566 is coupled to the bottom body 3524 to supply the drying fluid from a lower area of the inner space toward a bottom surface the substrate W placed on the support 3540. According to an embodiment, the bottom branch line 3566 is coupled to a center of the bottom body 3524. An exhaust line 3550 is coupled to the bottom body 3524. The supercritical fluid in the inner space 3502 of the body 3520 is exhausted to an outside of the body 3520 through the exhaust line 3550. The blocking plate 3580 may be disposed in the inner space 3502 of the body 3520. The blocking plate 3580 may be provided in a disk shape. The blocking plate 3580 is supported by the support 3582 to be spaced apart upwardly from the bottom surface of the body 3520. A plurality of supports 3582 are provided in a rod shape and are spaced apart from each other by a preset distance. When viewed from above, the blocking plate 3580 may be provided to overlap a discharge port of the bottom branch line 3566 and an inlet of the exhaust line 3550. The blocking plate 3580 may prevent the substrate W from being damaged by directly discharging the drying fluid supplied through the bottom branch line 3566 toward the substrate W.

Referring back to FIG. 3 to FIG. 6, the wet treating chamber 3200 may supply the treating liquid to perform a liquid treating process on the substrate W. The wet treating chamber 3200 may perform a developing process on the substrate W. In this case, the treating liquid discharged from the wet treating chamber 3200 may be a developing liquid. The wet treating chamber 3200 may discharge the developing liquid onto the substrate W to which the exposing process has been performed.

The wet treating chamber 3200 may be disposed on the other side of the transfer chamber 3100, opposite the side where the back surface cleaning chamber 3300 and the heat treating chamber 3400 are disposed. The wet treating chamber 3200 may include a plurality of wet treating chambers 3200. The plurality of wet treating chambers 3200 may be stacked on each other. The wet treating chamber 3200 may be disposed to face the back surface cleaning chamber 3300 or the heat treating chamber 3400 with the transfer chamber 3100 interposed therebetween. The wet treating chamber 3200 may be disposed between the index module 20 and the supercritical chamber 3500. The wet treating chamber 3200 may be provided in a number corresponding to the supercritical chamber 3500. The wet treating chamber 3200 may be provided in a larger number than the rear cleaning chamber 3300. The wet treating chamber 3200 may be provided in a larger number than the heat treating chamber 3400. However, the inventive concept is not limited thereto, and may be changed in consideration of factors such as a foot printing and a process efficiency of the device.

Figure 12:
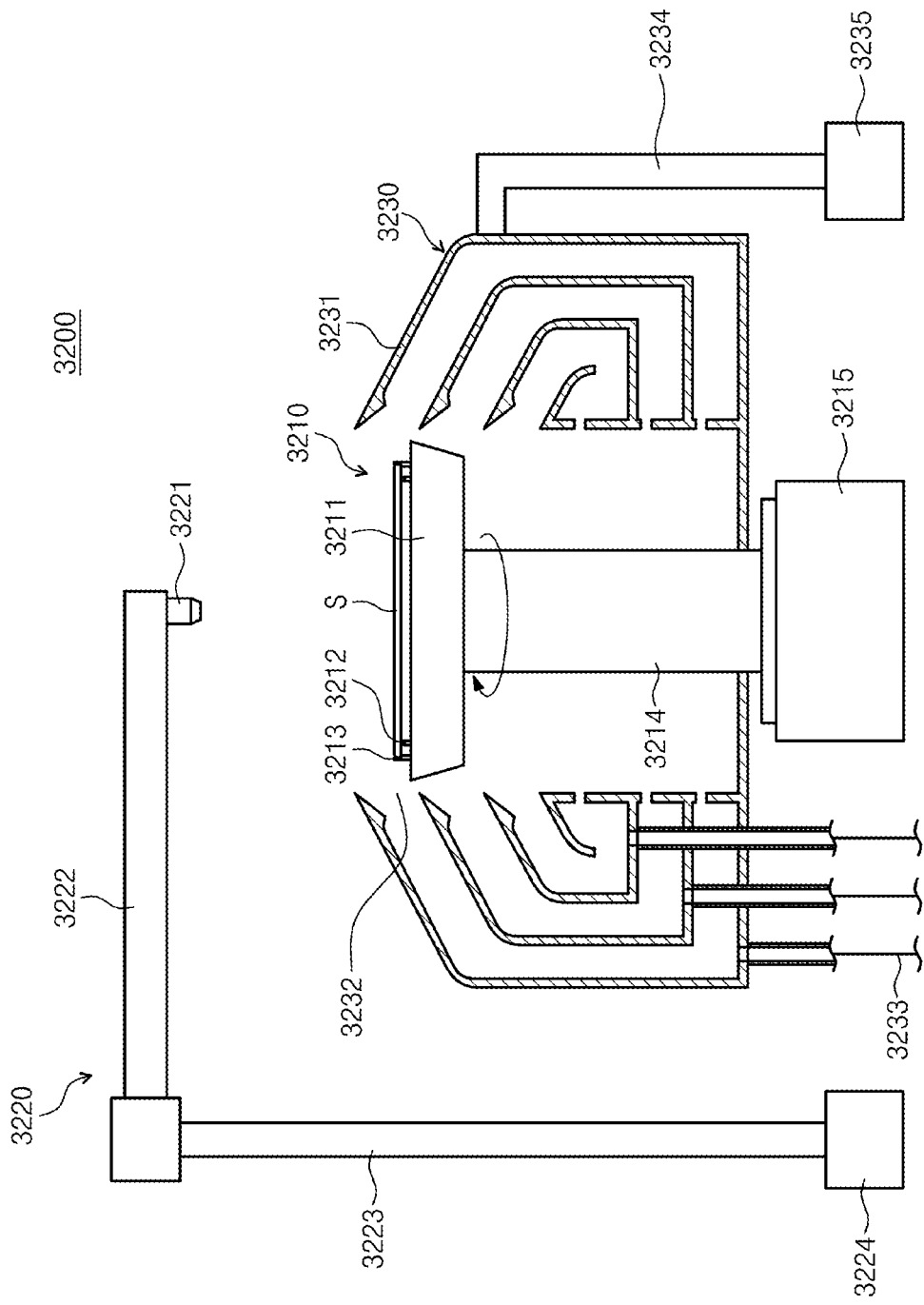
FIG. 12 schematically illustrates a wet treating chamber of the substrate treating apparatus according to an embodiment of the inventive concept.

FIG. 12 is a view schematically illustrating the wet treating chamber of a substrate treating apparatus according to an embodiment of the inventive concept. Referring to FIG. 12, the wet treating chamber 3200 may apply a developing liquid to the substrate W to develop the substrate W. A housing (not shown), a support unit 3210, a treating liquid supply member 3220, and a recollecting member 3230 may be included. The wet treating chamber 3200 may provide a treating space in which the substrate W is treated.

The support unit 3210 may support the substrate W. The support member 3100 may rotate the supported substrate S. The support unit 3210 may include a support plate 3211, a support pin 3212, a chuck pin 3213, a rotation shaft 3214, and a rotation driver 3215. The support plate 3211 may have a top surface having the same or similar shape as the substrate W. The support pin 3212 and the chuck pin 3213 may be provided on a top surface of the support plate 3211. The support pin 3212 may support the bottom surface of the substrate W. The support pin 3212 may upwardly protrude from the top surface of the support plate 3211. The chuck pin 3213 may fix a supported substrate W. The chuck pin 3213 may support a side portion of the supported substrate W. Accordingly, it is possible to prevent a rotating substrate W from moving in a lateral direction by a rotational force. The rotation shaft 3214 may be connected to a bottom portion of the support plate 3212. The rotation shaft 3214 may rotate the support plate 3211 by receiving the rotational force from the rotation driver 3215. Accordingly, the substrate W seated on the support plate 3211 may be rotated. The chuck pin 3213 may prevent the substrate W from leaving a correct position.

The supply member 3220 may inject the treating liquid onto the substrate W. The treating liquid may contain a developing liquid. The supply member 3220 may include a nozzle 3221, a nozzle bar 3222, a nozzle shaft 3223, and a nozzle shaft driver 3224. The nozzle 3221 may supply a developing liquid to the substrate W seated on the support plate 3211. The nozzle 3221 may be formed on a bottom surface of an end of the nozzle bar 3222. The nozzle bar 3222 may be coupled to the nozzle shaft 3223. The nozzle shaft 3223 may be provided to be elevated or rotated. The nozzle shaft driver 3224 may adjust a position of the nozzle 3221 by elevating or rotating the nozzle shaft 3223. The nozzle 3221 may be connected to a developing liquid supply line (not shown). The developing liquid supply line may be connected to a developing liquid supply source (not shown). A valve may be installed at the developing liquid supply line.

The recollecting member 3230 may include a recollecting container 3231, a recollecting line 3232, an elevating bar 3233, and an elevating driver 3234. The recollecting container 3231 may be provided in an annular ring shape surrounding the support plate 3211. A plurality of recollecting containers 3231 may be provided. A plurality of recollecting containers 3231 may be provided in a ring shape sequentially away from the support plate 3211 when viewed from above. A height of the recollecting container 3231 may be provided higher as a distance from the support plate 3211 increases. A recollecting port 3232 through which the developing liquid scattered from the substrate W flows may be formed in a space between the recollecting containers 3231. The recollecting line 3233 may be formed on a bottom surface of the recollecting container 3231. The elevating bar 3234 may be connected to the recollecting container 3231. The elevating bar 3231 may receive a power from the elevating driver 3235 to move the recollecting container 3231 in the up/down direction. When there are a plurality of recollecting containers 3231, the elevating bar 3233 may be connected to a recollecting container 3231 disposed at the outermost side. The elevating driver 3235 may elevate the recollecting container 3231 through the elevating bar 3234 to adjust the recollecting port 3232 through which the treating liquid scattered among the plurality of recollecting ports 3232 flows.

In another embodiment, the wet treating chamber 3200 may perform a cleaning process on the substrate W. In this case, the treating liquid discharged from the wet treating chamber 3200 may be a cleaning liquid. The cleaning liquid may include a chemical, a deionized water DIW, and an organic solvent. The organic solvent may include an isopropyl alcohol IPA. In this case, the nozzle member 3220 of the wet treating chamber 3200 may include a chemical supply member, a deionized water supply member, and an organic solvent supply member, respectively. The wet treating chamber 3200 may clean the patterned surface of the substrate W. In this case, the substrate treating apparatus does not include a heat treating chamber 3400. Accordingly, the wet treating chamber 3200 and the back surface cleaning chamber 3300 may be provided in a number corresponding to each other.

Referring back to FIG. 3 to FIG. 6, a plurality of buffer chambers 3600 may be provided. Some of the buffer chambers 3600 may be disposed between the index module 20 and the transfer chamber 3100. Hereinafter, these buffer chambers are referred to as front buffers 3602. A plurality of front buffers 3602 are provided and are positioned to be stacked on each other in the up/down direction. Some of the buffer chambers 3602 and 3604 may be disposed at one side of the transfer chamber 3100, opposite side near the index module 20. Hereinafter, these buffer chambers are referred to as rear buffers 3604. A plurality of rear buffers 3604 are provided and may be positioned to be stacked on each other in the up/down direction. Each of the front buffers 3602 and the rear buffers 3604 may temporarily store a plurality of substrates W. A substrate W stored in the front buffer 3602 may be carried in or out by the index robot 2200 and the transfer robot 3120. A substrate W stored in the rear buffer 3804 may be carried in or out by the transfer robot 3120.

The substrate treating apparatus may further include a controller (not shown) for controlling the transfer unit. In an embodiment, the controller may control the transfer unit so that the substrate W is brought into the wet treating chamber 3200 and then into the supercritical chamber 3500. The substrate W is developed by the developing liquid in the wet treating chamber 3200, and a developing liquid remaining on the substrate W may be removed at the supercritical chamber 3500.

In another embodiment, the controller may control the transfer unit so that the substrate W is brought into the wet treating chamber 3200 and then into the supercritical chamber 3500. In this case, the patterned surface of the substrate W is cleaned in the wet treating chamber 3200, and an organic solvent remaining on the substrate W may be removed in the supercritical treating chamber 3500.

Hereinafter, a supercritical chamber and a substrate treating method according to the inventive concept will be described in more detail with reference to the drawings.

Figure 13:
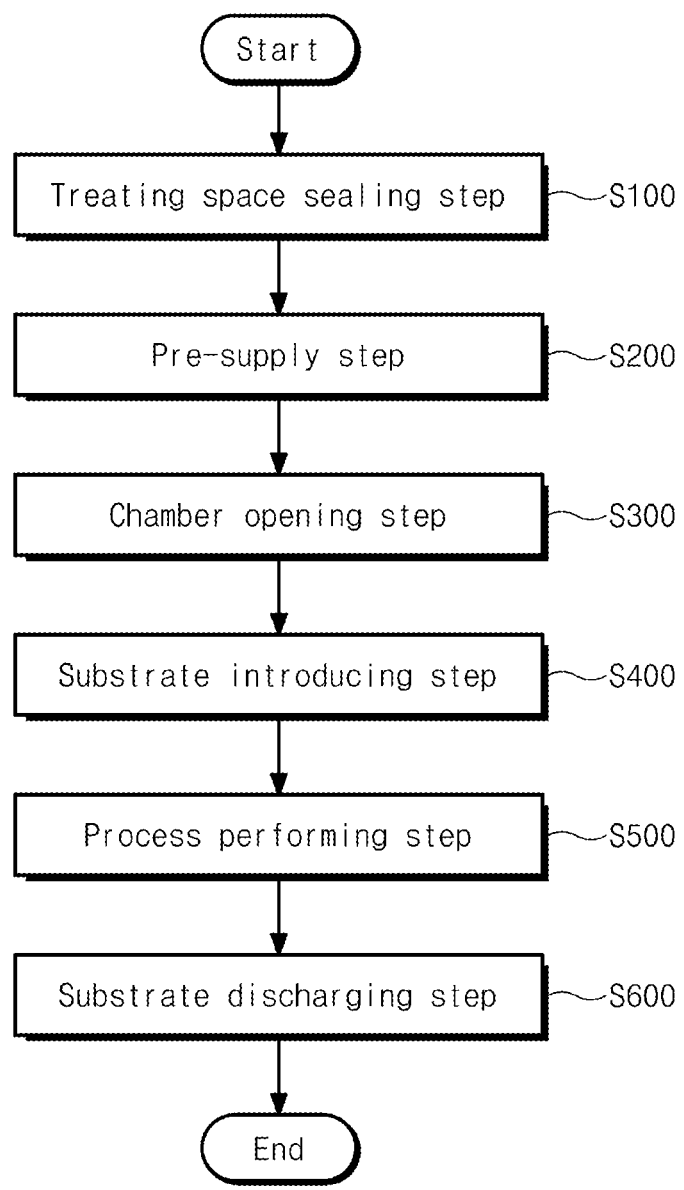
FIG. 13 is a flowchart of a substrate treating method according to an embodiment of the inventive concept.
Figure 14:
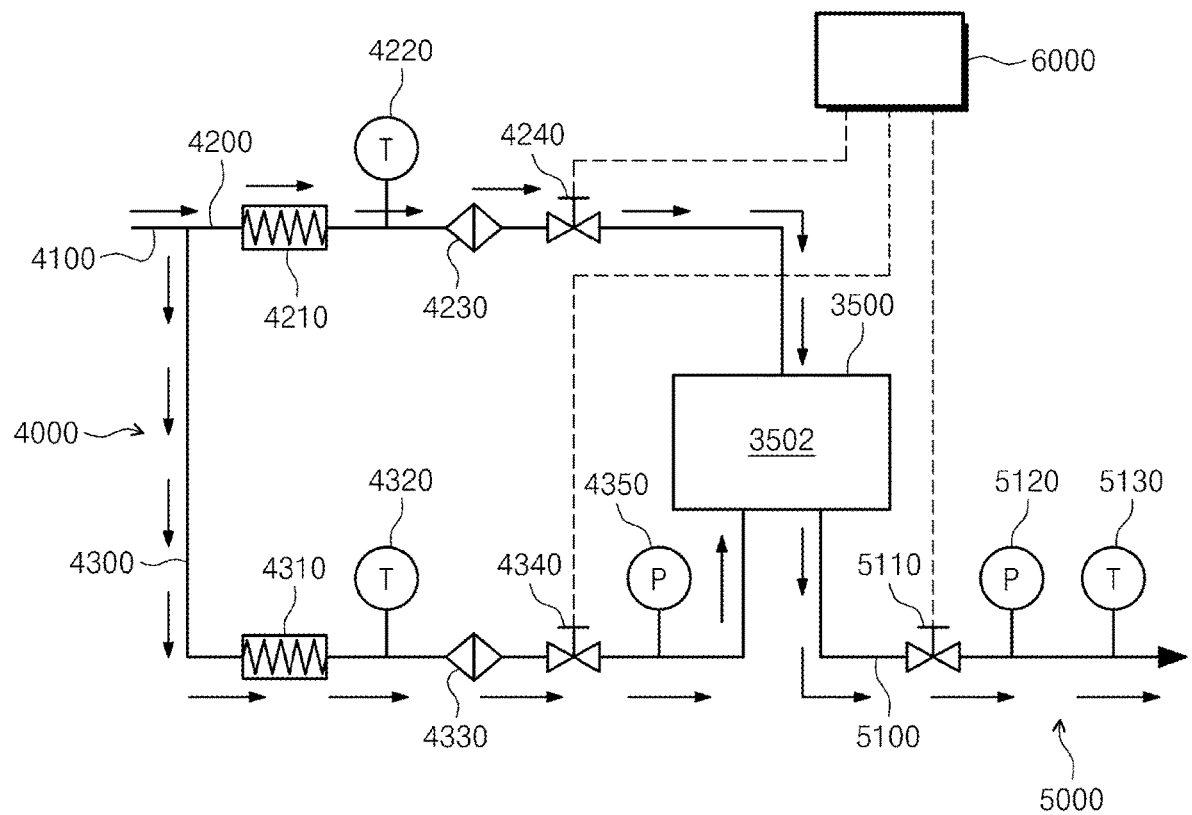
FIG. 14 illustrates a supercritical chamber according to an embodiment of the inventive concept.

FIG. 13 is a flowchart of a substrate treating method according to an embodiment of the inventive concept, and FIG. 14 illustrates a substrate treating apparatus according to an embodiment of the inventive concept.

Referring to FIG. 13 and FIG. 14, the substrate treating apparatus may include a supply unit 4000 supplying a treating fluid to a treating space 3502 inside the supercritical chamber 3500, an exhaust unit 5000 exhausting an atmosphere inside the supercritical chamber 3500, and a controller 6000 controlling the supply unit 4000 and the exhaust unit 5000.

The supply unit 4000 may include a supply source (not shown) in which the treating fluid is stored, a main supply line 4100 connected to the supply source, a top supply line 4200 branched from the main supply line 4100 and connected to a top wall of the chamber 3500, and a bottom supply line 4300 branched from the main supply line 4100 and connected to a bottom wall of the chamber 3500. The supply unit 4000 may further include a first heater 4210 to heat the treating fluid, a first temperature sensor 4220, a first filter 4230, and a top opening/closing valve 4240, installed on the top supply line 4200. In this case, the first heater 4210, the first temperature sensor 4220, the first filter 4230, and the top opening/closing valve 4240 may be sequentially installed downstream of the supply source. In addition, the supply unit 4000 may further include a second heater 4310 installed on the bottom supply line 4300 to heat the treating fluid, a second temperature sensor 4320, a second filter 4330, a bottom opening/closing valve 4340, and a first pressure sensor 4350, installed on the bottom supply line 4300. The second heater 4310, the second temperature sensor 4320, the second filter 4330, the bottom opening/closing valve 4340, and the first pressure sensor 4350 may be sequentially installed downstream of the supply source.

The exhaust unit 5000 may include an exhaust line 5100 coupled to a bottom wall of the chamber 3500, an opening/closing valve 5110, a pressure sensor 5120, a temperature sensor 5130, and an outlet (not shown), installed on the exhaust line 5100. In this case, the opening/closing valve 5110, the pressure sensor 5120, the temperature sensor 5130, and the outlet may be sequentially installed downstream of the chamber 3500. That is, the opening/closing valve 5110, the pressure sensor 5120, the temperature sensor 5130, and the outlet may be sequentially disposed with respect to the chamber 3500.

The treating fluid may include the supercritical fluid. Specifically, $CO_2$ and $SCCO_2$ may be included. The treating fluid may be supplied to the treating space 3502 of the chamber 3500 through the main supply line 4100, the top supply line 4200, and the bottom supply line 4300. The first heater 4210 may heat the treating fluid passing through the top supply line 4200. The first temperature sensor 4220 may sense a temperature of the treating fluid heated by the first heater 4120. The first temperature sensor 4210 may transmit a sensed temperature of the treating fluid to the controller 6000. The first filter 4210 may filter the treating fluid passing through the top supply line 4200. The first filter 4210 may remove foreign substances and impurities contained in the treating fluid passing through the top supply line 4200 to the chamber 3500. The first filter 4230 may be installed between the first heater 4210 and the top opening/closing valve 4240. The top opening/closing valve 4240 may adjust a flow rate of the treating fluid introduced through an inlet of the top wall of the chamber 3500.

The second heater 4310 may heat the treating fluid passing through the bottom supply line 4300. The second temperature sensor 4320 may sense a temperature of the treating fluid heated by the second heater 4310. The second temperature sensor 4320 may transmit the sensed temperature of the treating fluid to the controller 6000. The second filter 4330 may filter the treating fluid passing through the bottom supply line 4300. The second filter 4330 may remove foreign substances and impurities contained in the treating fluid passing through the bottom supply line 4300 to the chamber 3500. The second filter 4330 may be installed between the second heater 4310 and the bottom opening/closing valve 4340. The bottom opening/closing valve 4340 may adjust a flow rate of the treating fluid introduced through an inlet of the bottom wall of the chamber 3500. The first pressure sensor 4350 may sense the pressure of the treating fluid flowing through the bottom supply line 4300. The first pressure sensor 4350 may transmit a sensed pressure to the controller 6000.

The exhaust unit 5000 may discharge the treating fluid inside the chamber 3500 to an outside. The treating fluid inside the chamber 3500 may be discharged to the outside through the exhaust line 5100. The opening/closing valve 5110 may control an exhaust flow rate by adjusting the flow rate of the treating fluid flowing through the exhaust line 5100. The pressure sensor 5120 may sense the pressure of the treating fluid flowing through the exhaust line 5100 and transmit the sensed value to the controller 6000. The temperature sensor 5130 may sense the temperature of the treating fluid flowing through the exhaust line 5100.

The controller 6000 may control the top opening/closing valve 4240, the bottom opening/closing valve 4340, and the opening/closing valve 5110 of the exhaust unit 5000 to supply and exhaust a heated treating fluid in the treating space before performing the treating process on the substrate in the treating space. In this case, the controller 6000 may control the top opening/closing valve 4240, the bottom opening/closing valve 4340, and the opening/closing valve 510 of the exhaust unit 5000 to supply and exhaust the heated treating fluid to the treating space 3502. The controller 6000 may control the top opening/closing valve 4240 and the bottom opening/closing valve 4340 to be opened and closed simultaneously before a treating process of the substrate W is performed. In this case, the treating fluid may be simultaneously supplied to the top supply line 4200 and the bottom supply line 4300 before the substrate W is introduced into the treating space. The controller 6000 may control the substrate W to be introduced into the treating space 3502 when the treating fluid is heated to a preset temperature or higher by the first and second heaters 4210 and 4310. In this case, the preset temperature may be a temperature lower than a critical temperature, which is a temperature at which the treating fluid starts to change to a supercritical state.

The substrate treating method according to the inventive concept may include a treating space sealing step S100, a pre-supply step S200, a chamber opening step S300, a substrate introducing step S400, a process performing step S500, and a substrate discharging step S500.

When a signal to introduce the substrate W is transmitted, the substrate sealing step S100 seals the treating space before the substrate is introduced. In the pre-supply step S200, the treating fluid may be supplied to and discharged from the treating space while the treating space is sealed. In this case, the treating fluid may be pre-heated to the preset temperature during a pre-supply of the treating fluid. In addition, in the pre-supply step S200, the treating fluid may be supplied via a first supply path in fluid communication with an upper zone of the treating space and a second supply path in fluid communication with a lower zone t of the treating space, and the treating fluid may be controlled to be simultaneously supplied to the first supply path and the second supply path. In the chamber opening step S300, when the temperature of the treating fluid sensed by the temperature sensor reaches the preset temperature, the controller may open the chamber 3500. In the substrate introduction step S400, the substrate may be introduced into the treating space. In the process performing step S500, the substrate may be treated by supplying the treating fluid heated to the preset temperature or higher to the treating space. In the substrate discharge step S500, when the treating of the substrate is completed, the treating space may be opened and the substrate may be taken out.

In the substrate treatment method according to the inventive concept, the method may perform a substrate treating process on a plurality of substrates. In this case, a treating space sealing step S100, a pre-supply step S200, a chamber opening step S300, a substrate introduction step S400, a process progress step S500, and a substrate discharging step S500 may be performed on each of the plurality of substrates. That is, the pre-supply step may be performed on each of a plurality of substrates to be treated.

Figure 15:
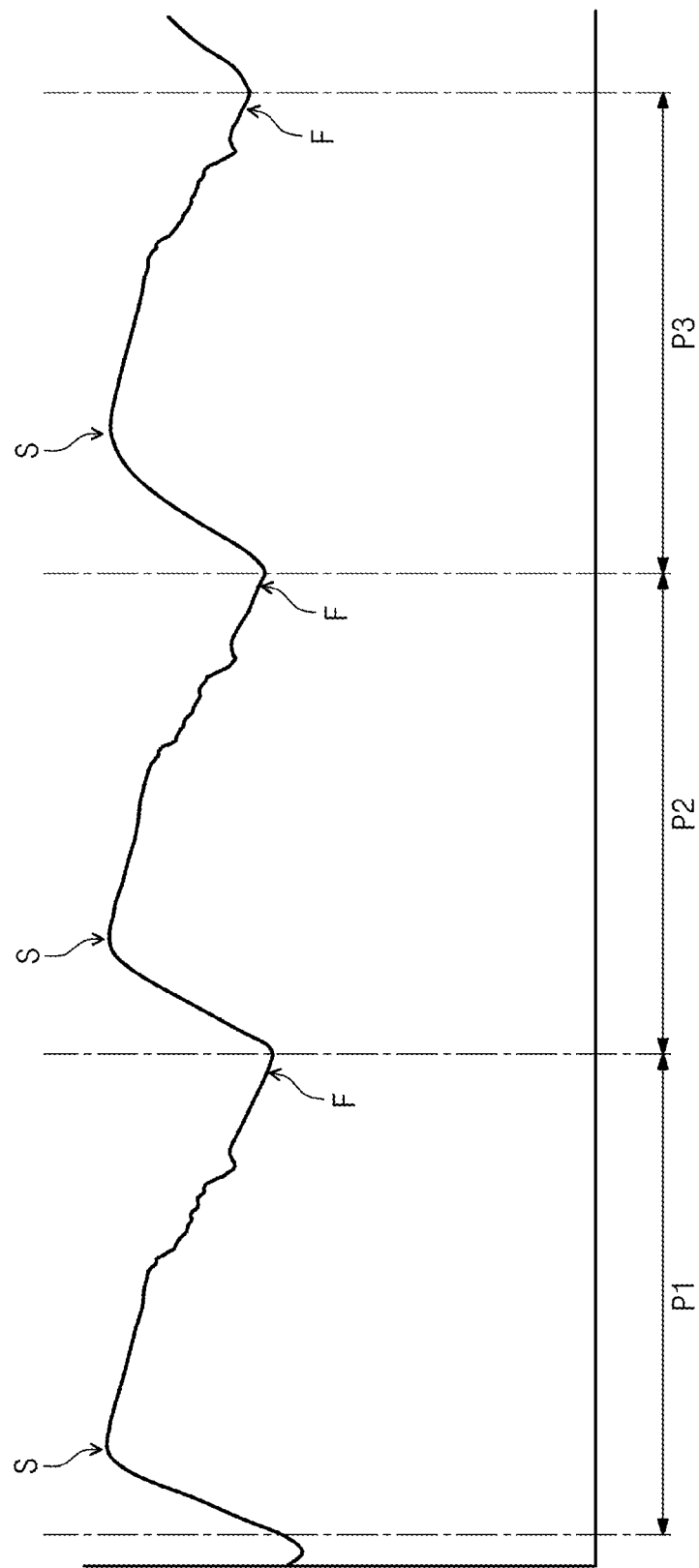
FIG. 15 is a graph illustrating a temperature of a treating fluid and a substrate introduction and discharge time point according to an embodiment of the inventive concept.

FIG. 15 is a graph illustrating a temperature of the treating fluid and a substrate introduction and discharge time point according to an embodiment of the inventive concept. 'S' in FIG. 15 means a substrate introduction time point, 'F' means a substrate discharge time point, and 'P1' means a substrate treating process is performed on one substrate. That is, FIG. 15 shows a treating process performed on a total of three substrates.

Referring to FIG. 15, in the substrate treating method according to the inventive concept, the substrate may be introduced in a state in which the treating fluid is heated to the preset temperature or higher so that a substrate treatment may be performed.

In a conventional supercritical treating apparatus, a heater is provided on a supply line to raise a temperature of the supercritical fluid. However, due to high pressure characteristics of the supercritical chamber, a substrate treating process proceeds in a state where the temperature of the fluid is not sufficiently raised by circulating the supercritical fluid, resulting in a process defect. Furthermore, since it is not a circulation structure, when the supercritical fluid is stagnated, a temperature of the fluid decreases, causing process defects. In addition, when an input interval between a consecutive input of substrates are different, there is a problem in that a uniform treatment is difficult because the temperature of the treating fluid is different for each input substrate.

However, according to the inventive concept, by exhausting the supercritical fluid through the treating space inside the chamber 3500 before the substrate treating process proceeds, the substrate may be introduced and treated while sufficiently raising the temperature of the fluid flowing through the supply line and the temperature of the chamber inside. Thus, resolving the above-mentioned problem. In addition, without a separate drain line for pre-circulation of the supercritical fluid, the temperature of the fluid may be sufficiently raised by pre-supplying the supercritical fluid using the supply line connected to the chamber, thereby simplifying the apparatus.

Conventionally, when the substrate W is dried after the developing treatment, a spin drying method in which the substrate W is rotated and dried is used. However, as a pattern formed on the substrate becomes finer, the conventional spin drying method causes a leaning phenomenon in which the patterns collapse or bend. However, according to an embodiment of the inventive concept, after performing a developing treatment on the substrate W, the substrate W is immediately transferred to the supercritical chamber 3500 while a developing liquid or a cleaning liquid remains in the substrate W. Since the supercritical chamber 3500 supplies the supercritical fluid to the substrate and dries the substrate, the above-described leaning phenomenon may be minimized. In addition, since the substrate W is transferred while the developing liquid or the cleaning liquid remains on the substrate W, it is possible to prevent the substrate being dried while the substrate is transferred, thereby avoiding degradation in a substrate quality.

According to the inventive concept, it is possible to provide an apparatus capable of efficiently performing the developing treatment. In addition, the inventive concept may provide a device capable of preventing a leaning phenomenon in which patterns collapse or bend. In addition, the inventive concept may provide a platform of the substrate treating apparatus capable of efficiently performing the developing process and the supercritical process. In addition, the inventive concept may provide a platform of the substrate treating apparatus capable of cleaning the non-patterned surface of the substrate. In addition, it is possible to prevent an occurrence of reverse contamination due to contaminants on the non-patterned surface of the substrate.

Referring to the above descriptions, the substrate W developed in the wet treating chamber 3200 has been dried in the supercritical chamber 3500 without a cleaning treatment in the wet treatment. However, as a modified embodiment, the wet treating chamber 3200 may further include a cleaning liquid supply member for supplying the cleaning liquid for cleaning the non-patterned surface of the substrate W. In this case, the cleaning liquid may include a thinner. In this case, the supercritical chamber 3500 may dry the thinner remaining on the substrate W.

The detailed description has been described in detail based on the substrate treating apparatus according to an embodiment of the inventive concept. However, the inventive concept is not limited to the above-described examples, and may be applied to any apparatus that treats a substrate.

What is claimed is:

1. A substrate treating apparatus comprising:
   a wet treating chamber configured to perform a developing process on a substrate by supplying a developing liquid;
   a treating chamber configured to treat the substrate by supplying a treating fluid;
   a heat-treating chamber configured to perform a heat-treating process on the substrate; and
   a transfer chamber configured to transfer the substrate between the wet treating chamber, the treating chamber, and the heat-treating chamber,
   wherein the treating chamber comprises:
   a chamber having a treating space therein;
   a supply line having a first open/close valve installed thereon and configured to supply the treating fluid to the treating space;
   a heater installed on the supply line and configured to heat the treating fluid;
   an exhaust line having a second open/close valve installed thereon and configured to exhaust the treating space; and
   a controller configured to control the first open/close valve and the second open/close valve such that the treating fluid heated is supplied to and exhausted from the treating space before a treating process is performed on the substrate in the treating space.

2. The substrate treating apparatus of claim 1, wherein the controller controls the first open/close valve and the second open/close valve to supply and exhaust the heated treating fluid to and from the treating space, before the substrate is introduced to the treating space.

3. The substrate treating apparatus of claim 1, wherein the supply line comprises a top supply line connected to a top wall of the chamber, and a bottom supply line connected to a bottom wall of the chamber, and
   wherein the heater comprises a first heater installed on the top supply line, and a second heater installed on the bottom supply line.

4. The substrate treating apparatus of claim 3, wherein the treating fluid is supplied substantially simultaneously to the top supply line and the bottom supply line before the substrate is introduced to the treating space.

5. The substrate treating apparatus of claim 1 further comprising a filter installed on the supply line at a downstream side of the heater.

6. The substrate treating apparatus of claim 1, wherein the controller controls such that the substrate is introduced to the treating space when the treating fluid is heated by the heater to a preset temperature or higher.

7. The substrate treating apparatus of claim 6, wherein the preset temperature is lower than a critical temperature of the treating fluid.

8. The substrate treating apparatus of claim 1, wherein the treating fluid is a fluid in a supercritical state.

9. The substrate treating apparatus of claim 3, wherein the first open/close valve comprises:
a top open/close valve installed on the top supply line; and
a bottom open/close valve installed on the bottom supply line, and
wherein the controller controls the top open/close valve and the bottom open/close valve to be simultaneously opened, before a treating process of the substrate is performed.

10. The substrate treating apparatus of claim 8, wherein the fluid in a supercritical state dries a developing liquid remaining on the substrate.

11. A substrate treating apparatus comprising:
an index module including a container for storing a substrate; and
a treating module configured to perform a process on the substrate, and
wherein the treating module comprises:
a buffer unit configured to temporarily store the substrate;
a wet treating chamber configured to perform a developing process on the substrate by supplying a developing liquid;
a supercritical treating chamber configured to treat the substrate by supplying a supercritical fluid;
a heat-treating chamber configured to perform a heat treating process on the substrate; and
a transfer chamber including a transfer unit configured to transfer the substrate between the wet treating chamber, the supercritical treating chamber, and the heat-treating chamber, and
wherein the supercritical treating chamber comprises:
a supply line configured to supply the supercritical fluid to a treating space therein;
a heater installed on the supply line and configured to heat the treating fluid;
an exhaust line configured to exhaust the treating space; and
a controller configured to control the supply line and the exhaust as to supply and exhaust the treating fluid heated to and from the treating space, before a treating process is performed on the substrate in the treating space.

12. The substrate treating apparatus of claim 11, wherein the supply line comprises a top supply line connected to a top wall of the chamber and a bottom supply line connected to a bottom wall of the chamber, and
wherein the heater comprises a first heater installed on the top supply line and a second heater installed on the bottom supply line.

13. The substrate treating apparatus of claim 12, wherein the controller controls such that the treating fluid is substantially supplied to the top supply line and the bottom supply line.

14. The substrate treating apparatus of claim 11, further comprising a filter installed on the supply line at a downstream side of the heater.

15. The substrate treating apparatus of claim 11, wherein the treating fluid is a fluid in a supercritical state.

16. A substrate treating method comprising:
a sealing step for sealing a treating space;
after the sealing step, a pre-supply step for supplying and discharging a treating fluid to and from the treating space;
after the pre-supply step, an introducing step for introducing the substrate to the treating space;
after the introducing step, a substrate treating step for treating the substrate by supplying the treating fluid to the treating space; and
after the substrate treating step, a taking out step for taking out the substrate from the treating space,
wherein the substrate is not provided in the treating space in the pre-supply step.

17. The substrate treating method of claim 16, wherein the introducing step is performed after the treating fluid is heated to a preset temperature or higher in the pre-supply step.

18. The substrate treating method of claim 16, wherein the treating fluid is supplied to the treating space via a supply path, the supply path comprising a first supply path in fluid communication with an upper zone of the treating space and a second supply path in fluid communication with a lower zone of the treating space, and
wherein the treating fluid is substantially simultaneously supplied to the first supply path and the second supply path.

19. The substrate treating method of claim 16, wherein the method performs a substrate treating process on a plurality of substrates; and
wherein the pre-supply step is performed on each of the plurality of substrates.

* * * * *